United States Patent
Lin et al.

(10) Patent No.: US 7,002,434 B2
(45) Date of Patent: Feb. 21, 2006

(54) LUMPED-ELEMENT TRANSMISSION LINE IN MULTI-LAYERED SUBSTRATE

(75) Inventors: Yo-Shen Lin, Taipei (TW); Ko-Mai Li, Taipei (TW)

(73) Assignee: Chi Mei Communication Systems, Inc., Tai-Nan (TW)

( * ) Notice: Subject to any disclaimer, the term of this patent is extended or adjusted under 35 U.S.C. 154(b) by 0 days.

(21) Appl. No.: 10/708,619

(22) Filed: Mar. 16, 2004

(65) Prior Publication Data

US 2005/0206470 A1  Sep. 22, 2005

(51) Int. Cl.
*H03H 7/00* (2006.01)
*H03H 7/09* (2006.01)

(52) U.S. Cl. .................. 333/167; 333/177; 333/185

(58) Field of Classification Search .......... 333/167, 333/177–180, 181, 185, 184; 336/200
See application file for complete search history.

(56) References Cited

U.S. PATENT DOCUMENTS

| | | | | |
|---|---|---|---|---|
| 2,153,857 A | * | 4/1939 | Wheeler | 330/176 |
| 3,858,126 A | * | 12/1974 | Kameya | 333/168 |
| 5,612,656 A | * | 3/1997 | Sakamoto et al. | 333/175 |
| 6,114,925 A | * | 9/2000 | Lo | 333/185 |
| 6,476,689 B1 | * | 11/2002 | Uchida et al. | 333/177 |
| 6,483,400 B1 | * | 11/2002 | Phillips, Jr. | 333/185 |
| 6,583,686 B1 | * | 6/2003 | Matsumura et al. | 333/175 |
| 6,587,025 B1 | * | 7/2003 | Smith et al. | 336/200 |
| 6,714,101 B1 | * | 3/2004 | Kim et al. | 333/177 |

FOREIGN PATENT DOCUMENTS

JP            10013180 A   *   1/1998

* cited by examiner

*Primary Examiner*—Seungsook Ham
(74) *Attorney, Agent, or Firm*—Winston Hsu (57) ABSTRACT

A lumped-element transmission line is formed in a multi-layered substrate. A mutual inductance between first and second inductors in a T-equivalent circuit model is enlarged to a designed positive value to widen the application frequency bandwidth of the transmission line. The second inductor is electrically connected to the first inductor in series at one end. The first and second inductors are spiral in shape and the orientations of the first inductor and the second inductor are the same so that the spirals progress in the same sense such that a mutual inductance between the first and second inductors is positive and equals a first value. A first capacitor is electrically connected to ground at a first end of the first capacitor, and a second end of the first capacitor is electrically connected to the end of the second inductor at which the second inductor in connected to the first inductor.

7 Claims, 12 Drawing Sheets

Fig. 12

LUMPED-ELEMENT TRANSMISSION LINE IN MULTI-LAYERED SUBSTRATE

BACKGROUND OF INVENTION

1. Field of the Invention

The present invention relates to a lumped-element transmission line, and more particularly, to a lumped-element transmission line realized in multi-layered substrate.

2. Description of the Prior Art

Transmission lines are widely used as building blocks in RF and microwave circuit designs. For example, transmission lines of quarter-wavelength long are often used as impedance transformers, or to create effective open- or short-circuits in RF circuits. However, the required physical lengths of these transmission lines are often quite long, such that they will occupy large circuit areas especially for low frequency applications.

Figure 1:
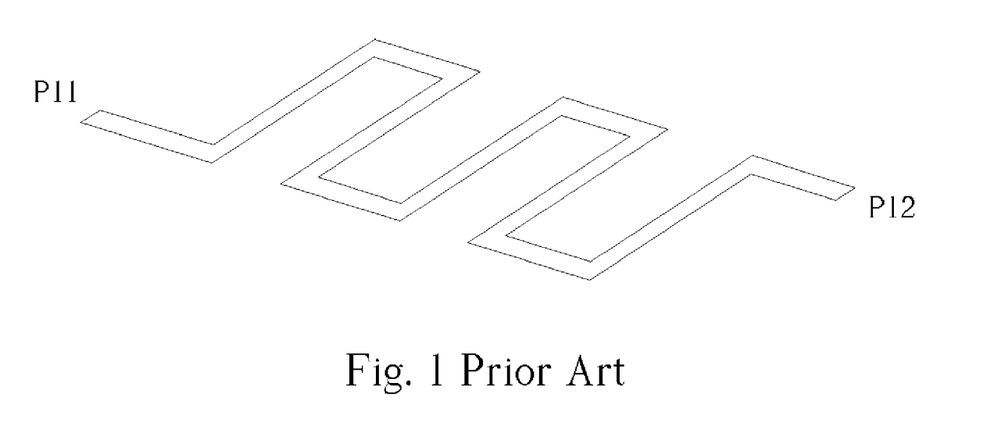
FIG. 1 is a diagram of a prior art meander line structured transmission line.
Figure 2:
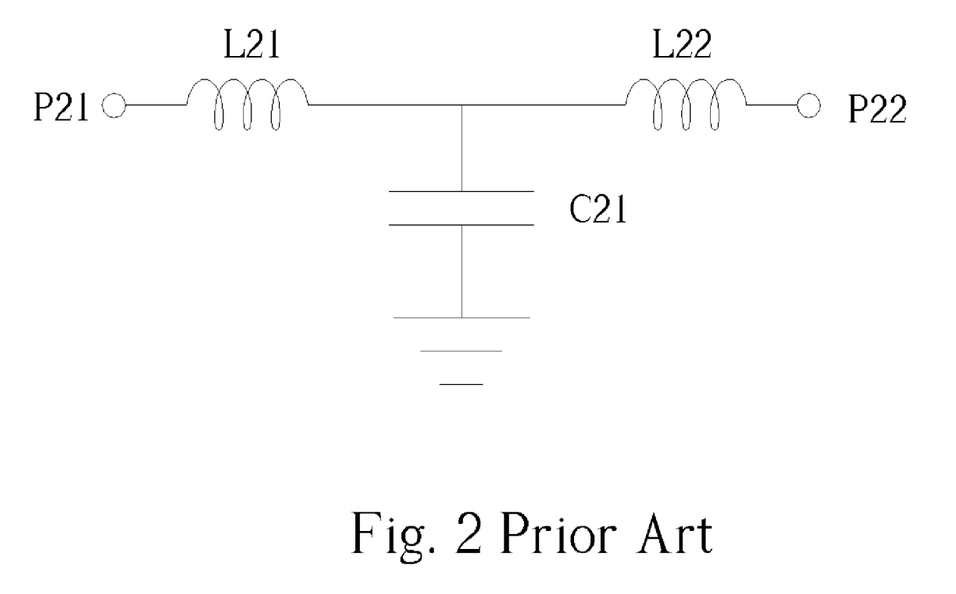
FIG. 2 is a diagram of a prior art T-equivalent circuit of a transmission line.
Figure 3:
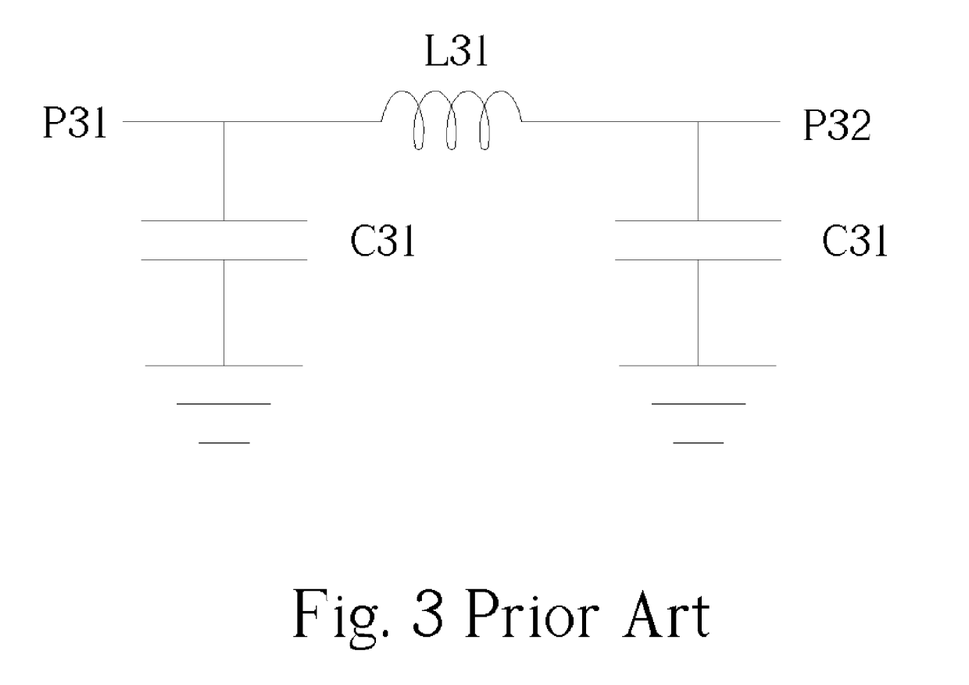
FIG. 3 is a diagram of a prior art π-equivalent circuit of a transmission line.
Figure 4:
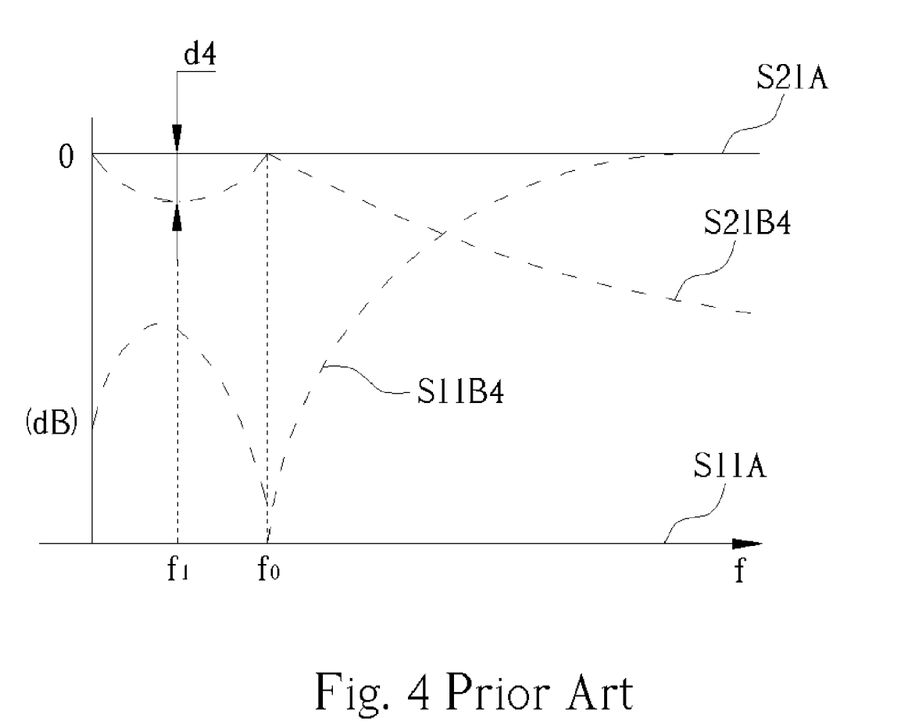
FIG. 4 is a diagram of frequency response of the prior art T- and π-equivalent circuits of transmission lines.

Conventionally, size reduction of transmission lines is accomplished by using meander line structures. Please refer to FIG. 1. FIG. 1 is a diagram of a prior art meander line structured transmission line with two ports P11 and P12. Utilizing the meander line structure reduces the size of the required transmission line, but the resulting circuit area is still too large for the requirements of modern wireless handheld devices. Alternatively, lumped-element realizations of transmission line may be employed. Please refer to FIG. 2 and FIG. 3. FIG. 2 is a diagram of a prior art T-equivalent circuit of a transmission line and FIG. 3 is a diagram of a prior art π-equivalent circuit of a transmission line. L21, L22, and L31 are inductors and C21, C31, and C32 are capacitors. P21 and P22, and P31 and P32 are ports of the transmission lines in FIG. 2 and FIG. 3 respectively. The circuits in FIG. 2 and FIG. 3 are accomplished by using lumped inductors and capacitors to realize the T- and π-equivalent circuits of transmission lines to reduce circuit size. FIG. 4 is a diagram of frequency response of a prior art T- or π-equivalent circuit of a transmission line compared to that of an ideal transmission line. In FIG. 4, the transverse axis represents frequency, and the vertical axis represents amplitude in dB. S11A and S21A are the reflection coefficient and transmission coefficient of an ideal transmission line, and S11B4 and S21B4 are the typical reflection coefficient and transmission coefficient of prior art T- or π-equivalent circuits of transmission lines. As shown in FIG. 4, these equivalent circuit models may only be considered as equivalents to ideal transmission lines in a very narrow bandwidth around the center frequency $f_0$ as the deviations in transmission and reflection coefficients at frequencies away from $f_0$ are quite large. For example, the difference between S21A and S21B4 at $f_1$ is as large as d4 on the frequency response chart. In addition, the transmission coefficients for T- and π-equivalent circuits of transmission lines decrease rapidly above $f_0$. These limit the usage of these equivalent-circuit models to narrow band applications. However, most recent RF systems occupy a wide frequency bandwidth and require wide-band circuit elements to keep favorable characteristics in the whole frequency band. Moreover, for multi-band RF communication systems, it is also required that the transmission line equivalent be operated at multiple frequencies.

There have been many approaches to try to solve the aforementioned problem but the improvement is limited. In addition, the poor frequency response of conventional lumped-element transmission line implementations becomes one of the thresholds in developing wide frequency band RF circuits.

SUMMARY OF INVENTION

It is therefore a primary objective of the claimed invention to provide a transmission line equivalent realized by lumped elements in a multi-layered substrate that can provide frequency response close to that of an ideal transmission line.

Briefly described, the claimed invention discloses a lumped-element transmission line in which the T-equivalent circuit model of a transmission line described above is adopted. In the claimed invention, a mutual inductance between first and second inductors in a T-equivalent circuit model is enlarged to a designed positive value to widen the applicable frequency bandwidth of the transmission line equivalent. The second inductor is electrically connected to the first inductor in series at one end. The first and second inductors are spiral in shape and the orientations of the first inductor and the second inductor are the same so that the spirals progress in the same sense such that a mutual inductance between the first and second inductors is positive and equals a first value. A first capacitor is electrically connected to ground at a first end of the first capacitor, and a second end of the first capacitor is electrically connected to the end of the second inductor at which the second inductor in connected to the first inductor.

It is an advantage of the claimed invention that utilization of the mutual inductance improves frequency response of the lumped-element transmission line for a wide-band application. In the claimed invention, the circuit area of the transmission line is reduced by adopting the T-equivalent circuit model, and the associated frequency response close to that of an ideal transmission line for a wider frequency bandwidth is obtained. As transmission lines are widely used as building blocks in RF circuit design, a significant savings in circuit area, and hence cost in manufacturing, is obtained.

These and other objectives of the claimed invention will no doubt become obvious to those of ordinary skill in the art after reading the following detailed description of the preferred embodiment that is illustrated in the various figures and drawings.

DETAILED DESCRIPTION

Figure 5:
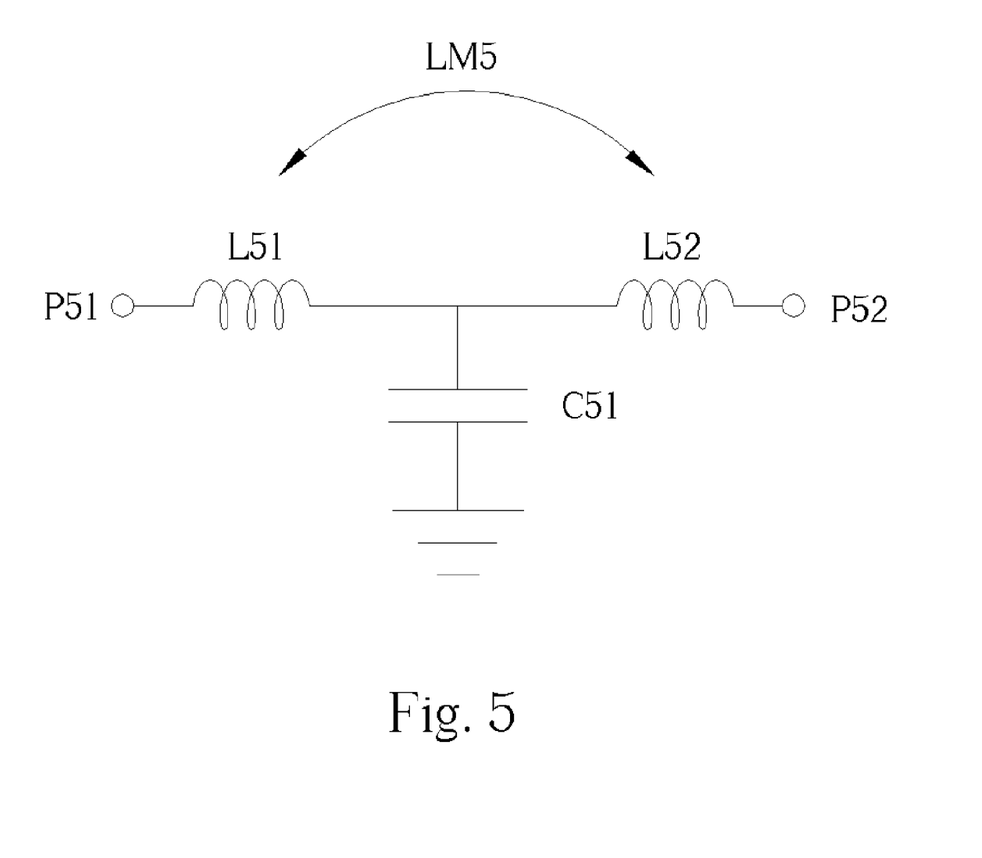
FIG. 5 is a diagram of a lumped-element transmission line showing mutual inductance between inductors.
Figure 6:
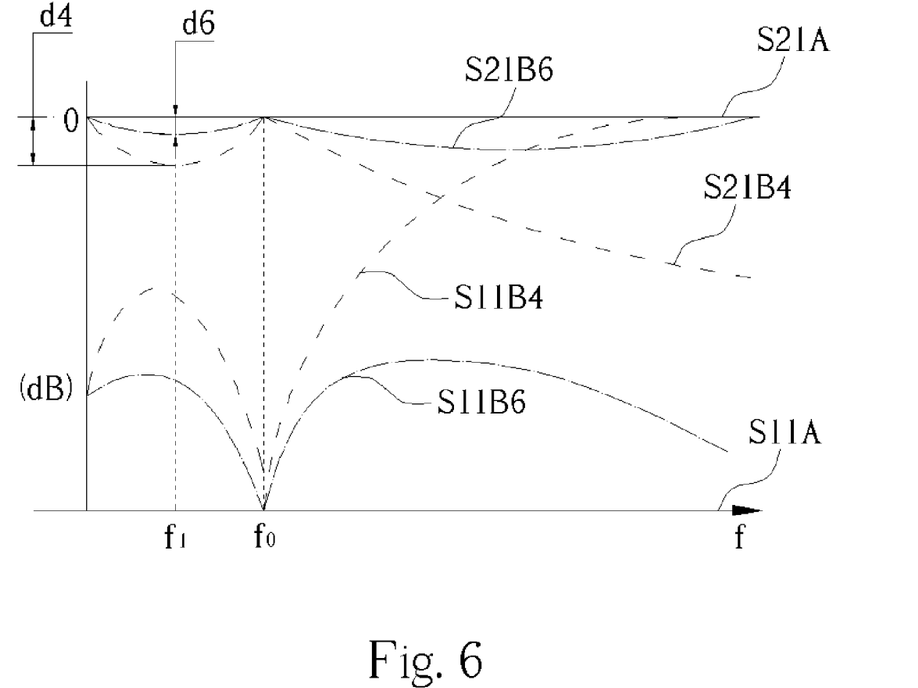
FIG. 6 is a diagram of frequency response of a present invention lumped-element transmission line.

Please refer to FIG. 5. FIG. 5 is a diagram of a T-equivalent circuit model of a transmission line showing a mutual inductance between inductors. FIG. 5 illustrates inductors L51 and L52, and a mutual inductance LM5 between the inductors L51 and L52. Further shown is a capacitor C51. As we know, even in the prior art, there is mutual inductance between two inductors as it is a natural physical phenomenon. The mutual inductance affects frequency response of the circuit and it is therefore avoided as much as possible in the prior art. However, the claimed invention introduces a positive mutual inductance for improving the frequency response of the lumped-element transmission line. FIG. 6 is a diagram of frequency response of a present invention lumped-element transmission line compared with that of a conventional T-equivalent circuit model in which no mutual inductance is presented and further compared with that of an ideal transmission line. The transverse axis represents operating frequency, and the vertical axis represents amplitude of frequency response in dB. Lines S11A and S21A are the reflection coefficient and the transmission coefficient of an ideal transmission line, respectively, curves S11B4 and S21B4 are the reflection coefficient and the transmission coefficient of the prior art T- or π-equivalent circuit of a transmission line as in FIG. 4, respectively, and curves S11B6 and S21B6 are the reflection coefficient and the transmission coefficient of the present invention lumped-element transmission line, respectively. As illustrated in FIG. 6, the frequency response of the present invention in which the mutual inductance is retained and designed as a positive value is quite close to the frequency response of an ideal transmission line in quite a wide band of frequency when compared with that of the T- or π-equivalent circuit models of the transmission lines of the prior art. For example, the difference between curves S21A and S21B6 at $f_1$ is d6 and is much smaller than the difference between curves S21A and S21B4 at $f_1$ denoted by d4 on the frequency response chart.

Figure 7:
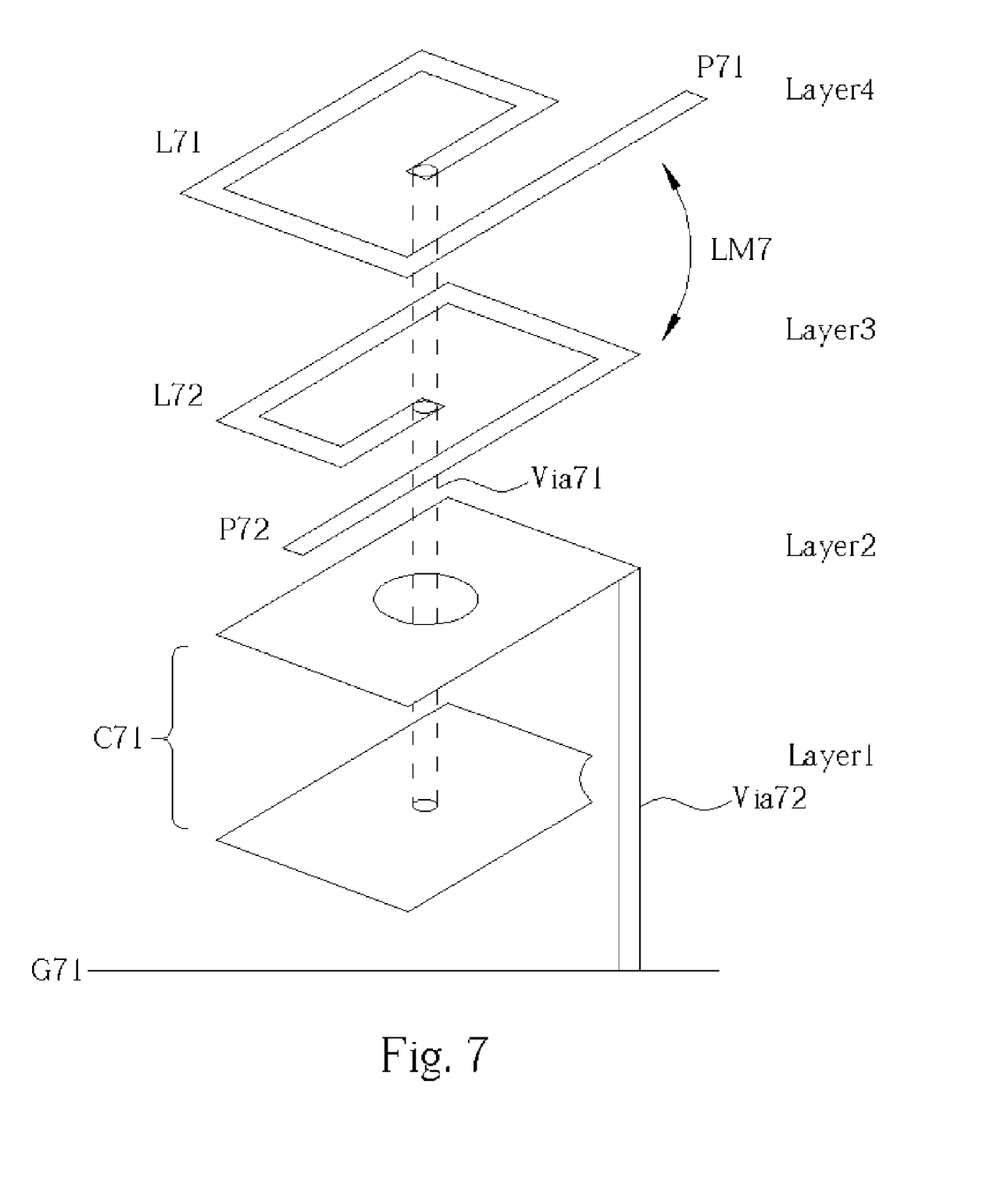
FIG. 7 is a diagram of a first embodiment of the present invention lumped-element transmission line realized in a multi-layered substrate.
Figure 8:
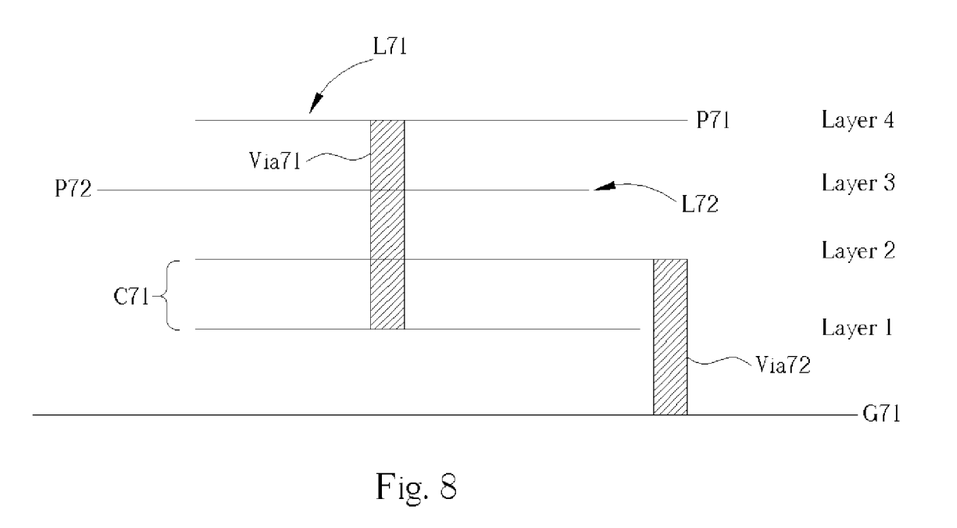
FIG. 8 is a side view diagram of FIG. 7.

The primary reason for adopting lumped-element transmission lines is to reduce circuit area. The utilization of mutual inductance in the present invention helps to widen the applicable frequency range of the lumped-element transmission line. It is known that the mutual inductance relates to the relative distance and geometrical relations between two inductors. Therefore, it is very applicable to implement the present invention in a 3-dimensional structure such as a multi-layered substrate. Please refer to FIG. 7. FIG. 7 shows the first embodiment of the present invention transmission line realized in a multi-layered substrate (layers 1–4) with a bottom ground plane G71. FIG. 7 illustrates inductors L71 and L72, a capacitor C71, and vias Via71 and Via72 penetrating the substrate and connecting different layers. The inductors L71 and L72 are realized with rectangular conductive spirals on layer 4 and layer 3 respectively. The inductor L72 is electrically connected to the inductor L71 in series through the via Via71. The capacitor C71 comprises two plates formed on layer 1 and layer 2 of the multi-layered substrate, in which the plate formed on layer 2 is connected to the ground plane G71 through the via Via72 and the plate formed on layer 1 is connected to the via Via71. Note that the orientations of inductors L71 and L72 are the same, such that a positive mutual inductance LM7 is established between inductors L71 and L72 with this arrangement. The mutual inductance LM7 may be adjusted to a designed positive value by appropriately varying the shapes of the inductors L71 and L72, or by selection of the distance between layer 3 and layer 4. The resulting circuit of FIG. 7 is equivalent to the circuit shown in FIG. 5 in which the inductances L71, L72, LM7, and the capacitance C71 correspond to the inductances L51, L52, LM5, and the capacitance C51 respectively. For an appropriate designed value of the positive mutual inductance LM7, the circuit of FIG. 7 and may achieve a ⅟₂₀ size reduction while maintaining a frequency response close to that of an ideal transmission line for a wide bandwidth as shown in FIG. 6. The value of the mutual inductance LM7 is determined according to an algorithm such that the frequency response of the transmission line meets a predetermined curve. FIG. 8 is a side view diagram of the circuit of FIG. 7.

Figure 9:
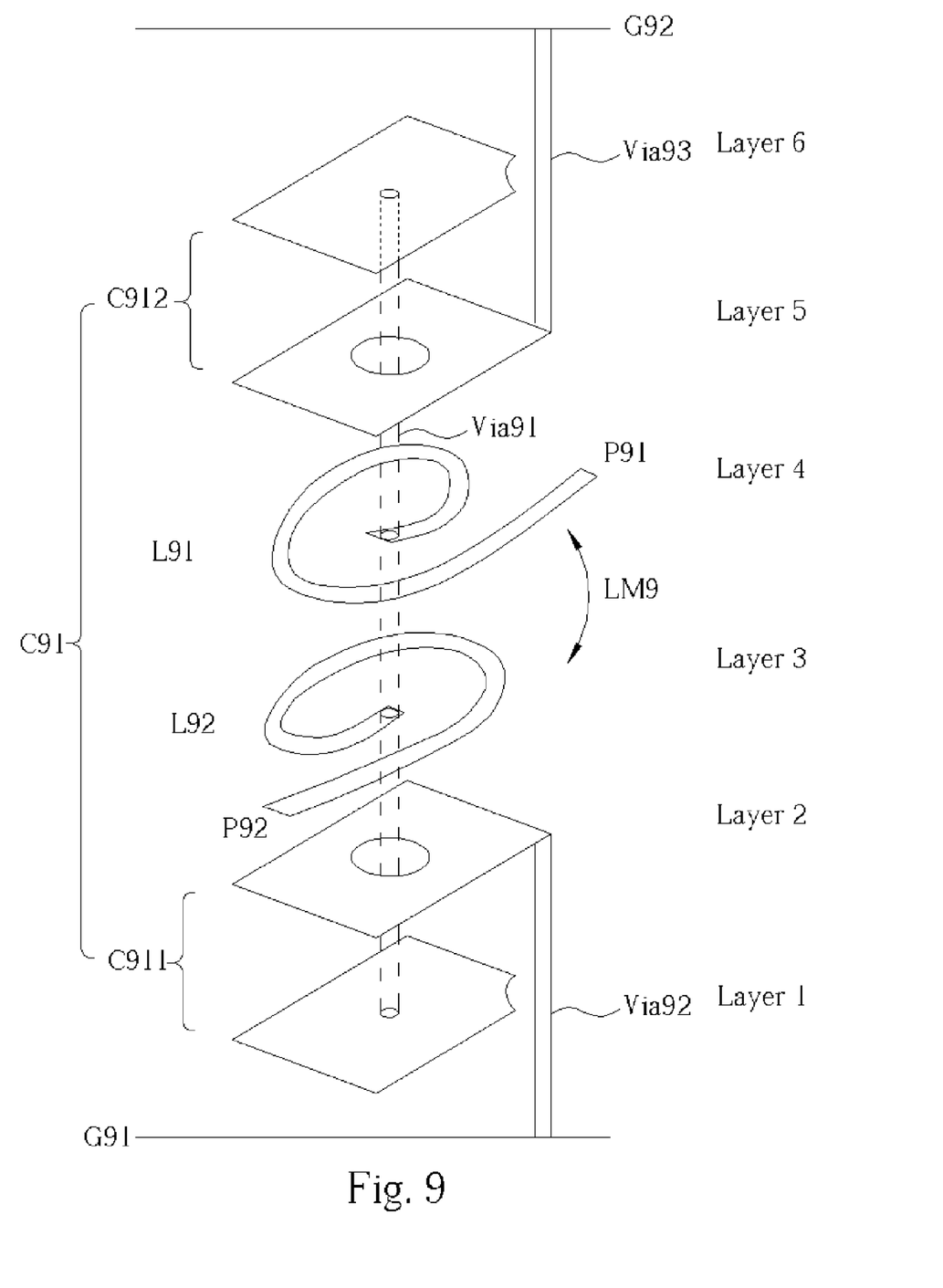
FIG. 9 is a diagram of a second embodiment of the present invention lumped-element transmission line realized in a multi-layered substrate.
Figure 10:
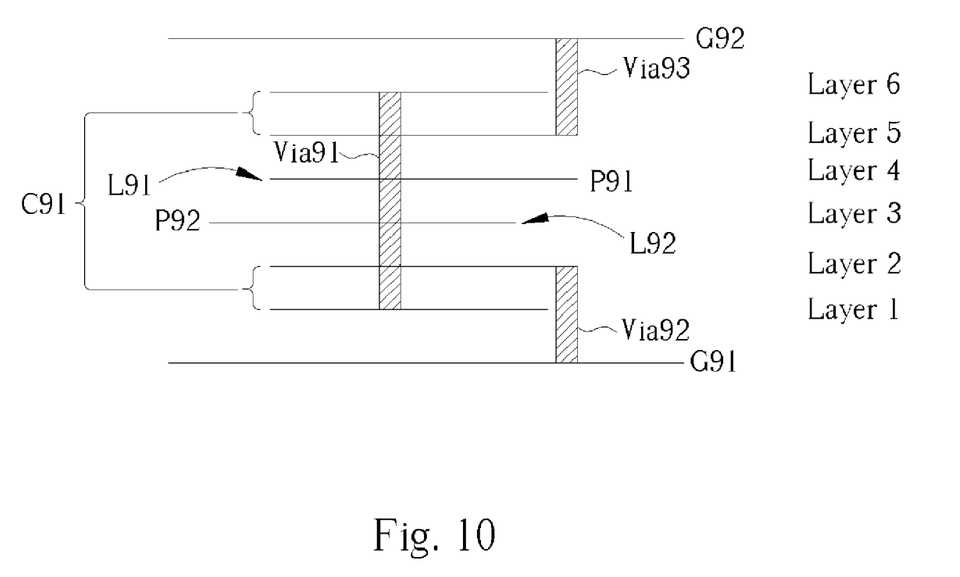
FIG. 10 is a side view diagram of FIG. 9.

FIG. 9 shows the second embodiment of the present invention transmission line realized in a multi-layered substrate with both a top ground plane G92 and a bottom ground plane G91. FIG. 9 illustrates inductors L91 and L92, a capacitor C91, and vias Via91, Via92, and Via93 penetrating the substrate and connecting different layers. The inductors L91 and L92 are realized by conductive circular spirals on layer 4 and layer 3 respectively. The inductor L92 is electrically connected to the inductor L91 in series through the via Via91 penetrating the substrate. The capacitor C91 comprises two sub capacitors C911 and C912 shunt-connected to each other, such that each of them can be made smaller. The capacitor C911 comprises two plates formed on layer 1 and layer 2 of the multi-layered substrate, in which the plate formed on layer 2 is connected to the ground plane G91 through the via Via92 and the plate formed on layer 1 is connected to the via Via91. The capacitor C912 comprises two plates formed on a layer 5 and layer 6 of the multi-layered substrate, in which the plate formed on layer 5 is connected to the ground plane G92 through the via Via93 and the plate formed on layer 6 is connected to the via Via91. Note that the orientations of inductors L91 and L92 are the same, such that a positive mutual inductance LM9 is established between inductors L91 and L92 with this arrangement. The mutual inductance LM9 may be adjusted to a designed positive value by appropriately varying the shapes of the inductors L91 and L92, or by selection of the distance between layer 3 and layer 4. The resulting circuit shown in FIG. 9 is equivalent to the circuit shown in FIG. 5 in which the inductances L91, L92, LM9, and capacitance C91 correspond to the inductances L51, L52, LM5, and capacitance C51 respectively. For an appropriate designed value of the positive mutual inductance LM9, the circuit of FIG. 9 may achieve a ⅟₂₀ size reduction while maintaining a frequency response close to that of an ideal transmission line for a wide bandwidth as shown in FIG. 6. The value of the mutual inductance LM9 is determined according to an algorithm such that the frequency response of the transmission line meets a predetermined curve. FIG. 10 is a side view diagram of the circuit of FIG. 9.

Figure 11:
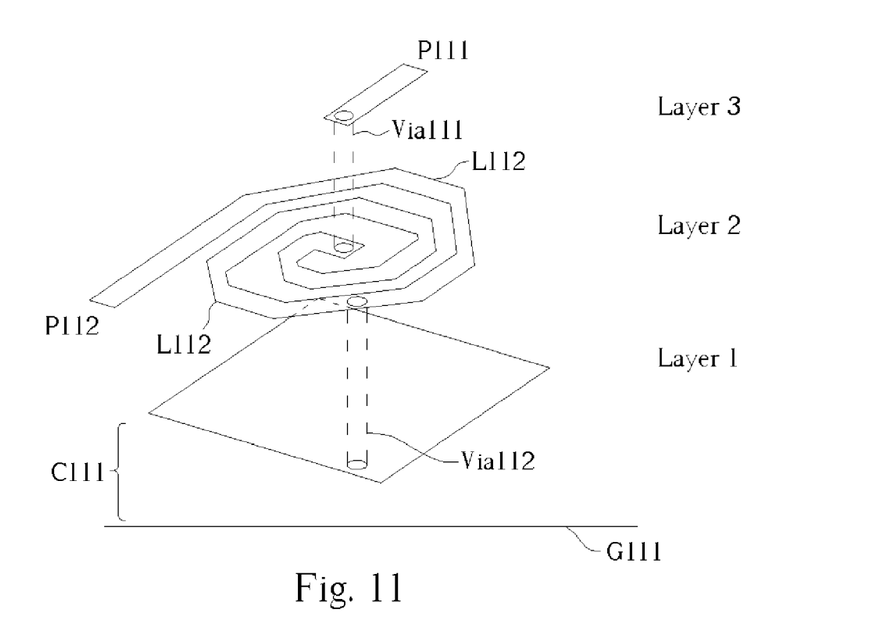
FIG. 11 is a diagram of a third embodiment of the present invention lumped-element transmission line realized in a multi-layered substrate.
Figure 12:
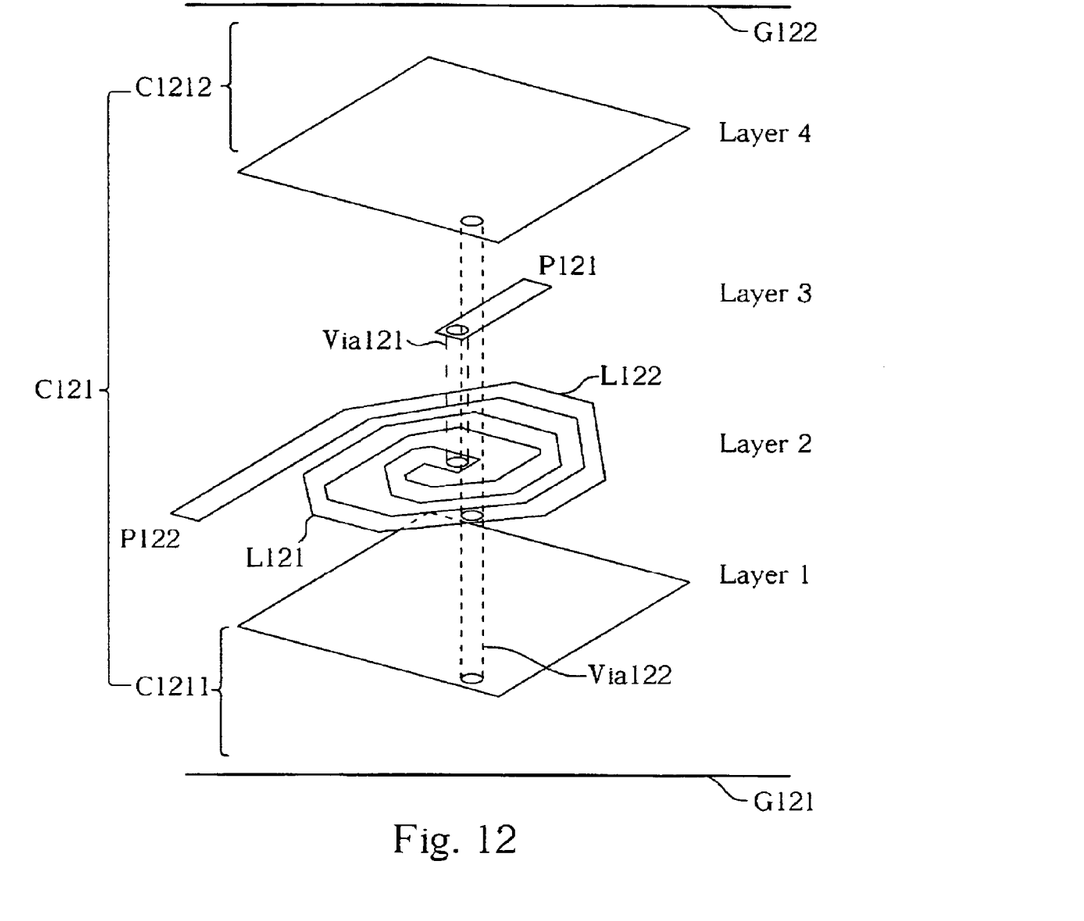
FIG. 12 is a diagram of a fourth embodiment of the present invention lumped-element transmission line realized in a multi-layered substrate.

Shown in FIG. 11 and FIG. 12 are alternative realizations of the equivalent-circuit model in FIG. 5. Please refer to FIG. 11. FIG. 11 shows the third embodiment of the present invention transmission line realized in a multi-layered substrate with a bottom ground plane G111. FIG. 11 illustrates inductors L111 and L112, a capacitor C111, and vias Via111 and Via112 penetrating the substrate and connecting different layers. The inductors L111 and L112 are realized by octagonal spirals on layer 2, and the inductor L112 is electrically connected to the inductor L111 in series at an end. The inductor L111 connects to a port P111 formed in layer 3 through the via Via111. The capacitor C111 is formed between a plate on layer 1 and the ground plane G111. The plate formed on layer 1 is connected to the via Via 112, which also connects to the end of the inductor L112 at which the inductor L112 is electrically connected to the inductor L111. Note that the orientations of inductors L111 and L112 are the same, though not shown in FIG. 11, a positive mutual inductance LM11 is established between the two spiral inductors L111 and L112, and may be adjusted to a designed positive value by appropriately varying the shapes of the inductors L111 and L122, or by selection of the distance between spirals. The resulting circuit of FIG. 11 is equivalent to the circuit shown in FIG. 5 in which the inductances L111, L112, LM11, and capacitance C111 correspond to the inductances L51, L52, LM5, and capacitance C51 respectively. For an appropriate designed value of the positive mutual inductance LM11, the circuit of FIG. 11 may achieve a ½₀ size reduction while maintaining a frequency response close to that of an ideal transmission line for a wide bandwidth as shown in FIG. 6. The value of LM11 is determined according to an algorithm such that the frequency response of the transmission line meets a predetermined curve Compared to the previous embodiments, the lumped-element transmission line in FIG. 11 has the advantage that it can be realized with fewer substrate layers, because the inductors L111 and L112 are formed on the same layer.

Please refer to FIG. 12. FIG. 12 illustrates the fourth embodiment of the present invention transmission line that is similar to the third embodiment shown in FIG. 11. The embodiment shown in FIG. 12 is realized in a multi-layered substrate with both a bottom ground plane G121 and a top ground plane G122. The structures of the inductors L121 and L122 are as the same as the inductors L111 and L112 in FIG. 11. A capacitor C121 comprises two sub capacitors C1211 and C1212 shunt-connected together. The capacitor C1211 is formed between a plate on layer 1 and the ground plane G121. The plate formed on layer 1 is connected to a via Via122, which also connects to the end of the inductor L122 at which the inductor L122 is electrically connected to the inductor L121. The capacitor C1212 is formed between a plate on layer 4 and the ground plane G122. The plate formed on layer 4 is connected to the via Via122. As described in the first three embodiments, the positive mutual inductance between the inductors L121 and L122 can be selected so that the frequency response of the present invention transmission line realized in FIG. 12 is very close to that of an ideal transmission line in a wide frequency range such as that illustrated in FIG. 6.

The present invention adapts the conventional T-equivalent circuit model of a transmission line to reduce the size of a circuit and utilizes a mutual inductance between inductors to widen the applicable frequency range of the present invention lumped-element transmission line. The lumped-element transmission line of the present invention is preferably formed in a multi-layered ceramic substrate such as a low temperature co-fired ceramic (LTCC) substrate for its lower substrate loss. For the circuits in all embodiments described above, the spiral inductors can be rectangular, circular, or octagonal in shape. The inductors can also occupy more than one layer for larger inductance values or for controlling the mutual inductance between them. For the capacitor to ground, more or fewer substrate layers may be used to achieve this depending on the value of the capacitance. The performance of the present invention has been proven by experiment and the frequency response is very close to that of an ideal transmission line in a wide frequency range.

In contrast to the prior art, the size of the present invention lumped-element transmission line is much smaller than the prior art meander line structured transmission line illustrated in FIG. 1. In addition, with the utilization of the mutual inductance, the frequency response of the present invention lumped-element transmission line is much closer to the ideal transmission line in a wider application frequency bandwidth than that of the prior art T- or π-equivalent circuit model.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A lumped-element transmission line formed in a multi-layered substrate comprising:
    a first inductor formed on a fourth layer of the multi-layered substrate;
    a second inductor formed on a third layer of the multi-layered substrate and electrically connected to the first inductor in series through a first via penetrating the substrate;
    a first capacitor comprising two plates formed on a second layer and a first layer of the multi-layered substrate, wherein the plate formed on the second layer is connected to ground and the plate formed on the first layer is connected to the first via; and
    a positive mutual inductance formed between the first inductor and the second inductor for improving frequency response of the lumped-element transmission line wherein the positive mutual inductance equals to a first value.

2. The lumped-element transmission line of claim 1 wherein the first capacitor is shunt-connected to a second capacitor which comprises two plates formed on a fifth layer and a sixth layer of the multi-layered substrate, in which the plate formed on the fifth layer is connected to ground and the plate formed on the sixth layer is connected to the first via.

3. The lumped-element transmission line of claim 2 wherein the first and second capacitors sandwich the first and second inductors.

4. The lumped-element transmission line of claim 1 wherein the first and second inductors are rectangular, circular, or octagonal in shape.

5. The lumped-element transmission line of claim 1 wherein the first value is according to an applied frequency range and values of the first inductor, the second inductor, and the first capacitor.

6. The lumped-element transmission line of claim 1 wherein the first value is according to shapes of and relative distance between the first inductor and the second inductor so that the mutual inductance equals the first value.

7. The lumped-element transmission line of claim 1 wherein at least one inductor is formed on a plurality of layers of the multi-layered substrate.

* * * * *